United States Patent
Eickelmann et al.

(10) Patent No.: US 8,129,216 B2
(45) Date of Patent: Mar. 6, 2012

(54) METHOD OF MANUFACTURING SOLAR CELL WITH DOPING PATTERNS AND CONTACTS

(75) Inventors: Hans-Juergen Eickelmann, Mainz (DE); Michael Haag, Mainz (DE); Harold John Hovel, Yorktown Heights, NY (US); Rainer Krause, Mainz (DE); Markus Schmidt, Mainz (DE); Steven Erik Steen, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 96 days.

(21) Appl. No.: 12/432,293

(22) Filed: Apr. 29, 2009

(65) Prior Publication Data

US 2010/0279454 A1 Nov. 4, 2010

(51) Int. Cl.
*H01L 21/00* (2006.01)
*H01L 21/22* (2006.01)
*H01L 21/44* (2006.01)

(52) U.S. Cl. ............... 438/98; 257/E31.124; 438/549; 438/666

(58) Field of Classification Search ............... 438/98, 438/549, 666; 257/E31.124
See application file for complete search history.

(56) References Cited

U.S. PATENT DOCUMENTS

| 4,359,487 A | * | 11/1982 | Schneider ............. 427/75 |
| 6,423,567 B1 | * | 7/2002 | Ludemann et al. ..... 438/83 |
| 2002/0153039 A1 | * | 10/2002 | Moon et al. ............ 136/256 |
| 2009/0068783 A1 | * | 3/2009 | Borden ................. 438/57 |

* cited by examiner

*Primary Examiner* — Kevin Parendo
(74) *Attorney, Agent, or Firm* — Gail H. Zarick, Esq.; Lily Neff, Esq.

(57) ABSTRACT

A method of manufacturing a solar cell. The method includes the steps of providing a substrate, applying a first dopant to a first surface, applying a second dopant to a second surface, covering the doped first surface with a hard mask, applying a third dopant to the substrate side, removing the hard mask, applying a pattern of first electrical contacts to the doping pattern, and applying a pattern of second electrical contacts to the doped second surface, the pattern of second electrical contacts and the doping pattern being straight-lined opposed.

14 Claims, 10 Drawing Sheets

METHOD OF MANUFACTURING SOLAR CELL WITH DOPING PATTERNS AND CONTACTS

BACKGROUND OF THE INVENTION

1. Field of the Invention

The invention relates to a method of manufacturing a solar cell.

2. Description of the Related Art

Solar cells are devices, which convert light energy into electrical energy by the photovoltaic effect. Today, there is a high demand for solar cells because they have many applications. For example, solar cells are used for powering small devices like calculators. Further, an increasing demand in solar cells is due to their usage in vehicles and satellites. Solar cells even have the potential of substituting state of the art power plants as solar cell technology is a technology branch favored by society now. The reason for this favoring can be found in the fact that electricity produced by solar cells is renewable 'clean' electricity.

Solar cells include a semi-conducting material, which is used to absorb photons and generate electrons via the photovoltaic effect. A semi-conducting material typically used for manufacturing solar cells is silicon. In solar cells, silicon can be used either as mono- or polycrystalline silicon.

In order to make the silicon solar cell technology more competitive to other state of the art technologies, which also provide electrical energy, the effectiveness in solar cell production has to be continuously increased. This includes, for example in the case of silicon solar cells, a reduction of the thickness of the silicon material used for manufacturing of the solar cells. Reduction of the thickness reduces the silicon consumption and thus reduces the material cost, which is an important aspect because the silicon price is increasing continuously due to the limited amount of available silicon.

However, when decreasing the thickness of the silicon layers in a silicon solar cell, for example, recombination at the rear surface of the solar cell occurs. Recombination reduces the open circuit voltage and also the short circuit current density. One way to circumvent this is by using dual emitter solar cells. However, manufacturing dual emitter solar cells based on silicon is not standard due to high manufacturing and, therefore, production costs. Typically processes now involve lithography and sputter technologies, which are very expensive to use and maintain.

Therefore, there is a need to provide an improved method of manufacturing solar cells, wherein the production costs are reduced.

SUMMARY OF THE INVENTION

In accordance with the present invention there is provided a method of manufacturing a solar cell. The method includes providing a substrate, the substrate having a first surface and a second surface, the second surface being opposed to the first surface. The method further includes applying a first dopant to the first surface and a second dopant to the second surface, the application of the first dopant resulting in a doped first surface and the application of the second dopant resulting in a doped second surface. Further, the doped first surface is covered with a hard mask, the hard mask having a pattern of openings, the openings uncovering the doped first surface.

In a further method step, a third dopant is applied to a substrate side including the hard mask, wherein the application of the third dopant results in a doping pattern on the doped second surface, the spatial arrangement of the doping pattern corresponding to the spatial arrangement of the pattern of openings. The hard mask is removed and a pattern of first electrical contacts is applied to the doping pattern. A pattern of second electrical contacts is applied to the doped second surface, wherein the pattern of second electrical contacts and the doping pattern are straight line opposed.

In an alternative embodiment, instead of hard mask technologies other methods can be applied like lithography and screen printing.

The method according to the invention minimizes production costs because state of the art thermal processes for manufacturing of dual emitter solar cells can be abandoned. Thermal processes are time consuming and expensive, such that the manufacturing costs using the method of manufacturing a solar cell according to the invention can be reduced. Further, expensive lithography processes are replaced by masking techniques.

Further, the method according to the invention allows for replacing expensive sputtering processes with technologies such as soldering and printing, which reduces production costs. It further allows for passivating and anti-reflective coating, which has the advantage of recombination of charge carriers being minimized, enhancing the efficiency of the solar cell and absorbing as much light as possible by the solar cell, because reflection of photons is minimized.

Additionally, in the method of the invention, photons, which were not absorbed by the active solar cell material, are reflected back into the solar cell material such that the absorption probability of photons is increased by a factor of 2. The method further allows for soft stamping techniques, which are advantageous because they provide a fast and cheap method of providing masks to surfaces.

DETAILED DESCRIPTION OF THE PREFERRED EMBODIMENTS

Figure 1:
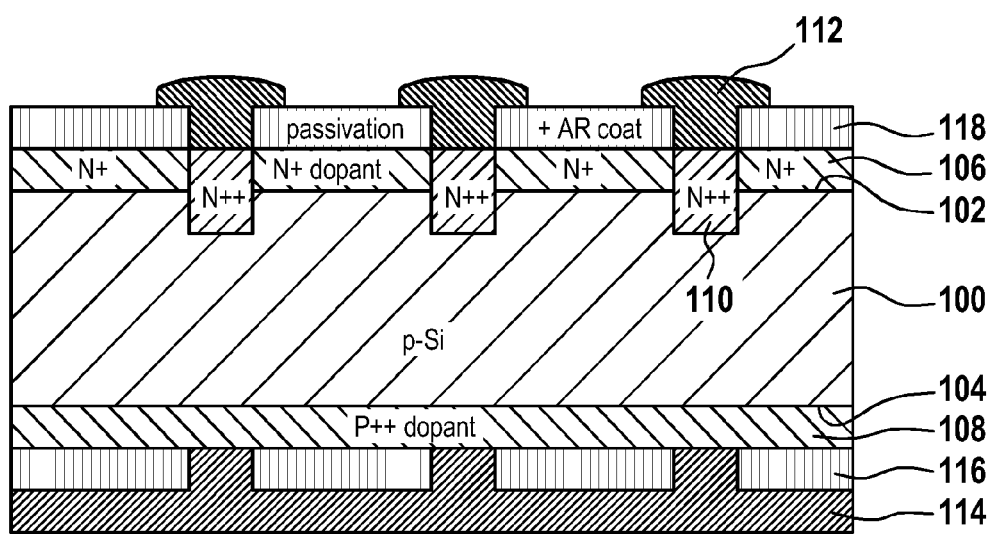
FIG. 1 illustrates a profile of a solar cell.

In the following, preferred embodiments of the invention will be described in greater detail by way of example only making reference to the drawings. Similar elements are depicted by the same reference numerals.

In accordance with an embodiment of the invention, the application of the pattern of first and second electrical contacts includes applying a layer to the substrate side including the first doped surface, selectively removing material of the layer straight line opposed to the spatial areas of the doping pattern, the removing of the material resulting in exposed layer areas and filling the exposed layer areas with electrical contact material.

In accordance with a further embodiment of the invention, the layer includes a polymer material, wherein the selectively removing of the material of the layer further includes applying a shadow mask to the layer, the shadow mask shadowing the layer at areas straight line opposed to the spatial areas of the doping pattern, curing the layer, the curing of the layer resulting in cured layer areas and uncured layer areas, wherein the uncured layer areas correspond to the shadow layer areas.

Further, the shadow mask is removed and an etchant is applied to the substrate side including the layer, wherein the application of the etchant results in the selectively removing of the layer material straight line opposed to the spatial areas of the doping pattern. Alternatively, instead of working with a shadow mask, a hard mask can be used which requires that the layer includes a resist material, wherein the selectively removing of the material of the layer includes covering the layer with a hard mask, the hard mask including a pattern of openings, the openings uncovering the layer at areas straight line opposed to the spatial areas of the doping pattern and exposing the substrate side including the layer. Subsequently, the hard mask is removed and an etchant is applied to the substrate side including the layer, the application of the etchant resulting in the selectively removing of the layer material straight line opposed to the spatial areas of the doping pattern due to the previous exposure.

In accordance with an embodiment of the invention, either after having performed the shadow mask technique or the hard mask technique, the method further includes removing of the layer. The removing of the layer is also called 'stripping' of the layer.

In accordance with an embodiment of the invention, the method further includes thermal treatment of the first and/or second electrical contacts.

In accordance with an embodiment of the invention, the method further includes passivating and/or anti-reflective coating of the doped first and second surface.

In accordance with an embodiment of the invention, the application of the first and second electrical contacts is performed by printing or soldering. As already mentioned above, printing and soldering significantly reduce the production costs of a solar cell.

In accordance with an embodiment of the invention, the substrate is p-doped silicon.

In accordance with a further embodiment of the invention, the first dopant is an n-dopant and the second dopant is a p-dopant.

In accordance with an embodiment of the invention, the third dopant is an n-dopant, wherein the doping pattern including the third dopant has a higher doping level than the first doped surface excluding the area including the third dopant. This has the advantage, that recombination of charge carriers is further minimized.

In accordance with an embodiment of the invention, the method further includes metallizing the substrate side including the first doped surface and the first electrical contacts.

FIG. 1 illustrates a profile of a solar cell which was manufactured using the method of manufacturing a solar cell according to the invention. The solar cell in FIG. 1 includes a substrate 100, which includes p-doped silicon. The top surface 102 of the substrate 100 is doped by an n+ dopant, which yields a doped first surface 106. The bottom 104 of the substrate 100 is doped by a p++ dopant, which yields a doped second surface 108.

The doped first surface 102 further includes a doping pattern 110, which is depicted in FIG. 1 as islands with a doping level n++, which is higher than the doping level n+ of the doped first surface 106. The islands 110 are partially penetrating into the substrate 100 and are also part of the doped first surface 106. On top of the doping pattern 110, first electrical contacts 112 are located. Second electrical contacts 114 are present straight line opposed to the doping pattern 110 directly below the doped second surface 108. By using the doping pattern 110 and positioning the first electrical contacts 112 directly above the doping pattern 110 and the second electrical contacts straight line opposed to the doping pattern 110, unwanted recombination of charge carriers is minimized.

Further shown in FIG. 1 are two passivation layers 116 and 118. The passivation layer 116 is located between the doped second surface 108 and the layer including the second electrical contacts 114. The second electrical contacts 114 interrupt the passivation layer 116 at the positions, which are straight line opposed to the islands of doping pattern 110. The same holds for a passivation layer 118, which is located on top of the doped surface 106. This passivation layer 118 may further include an anti-reflecting coating. The first electrical contacts pass through the passivation and coating layer 118 and contact directly the doping pattern 110. On top of the passivation layer 118, the first electrical contacts have a mushroom shaped head. The lower side of the mushroom shaped head covers parts of the top surface of the passivation layer 118.

Figure 2A:
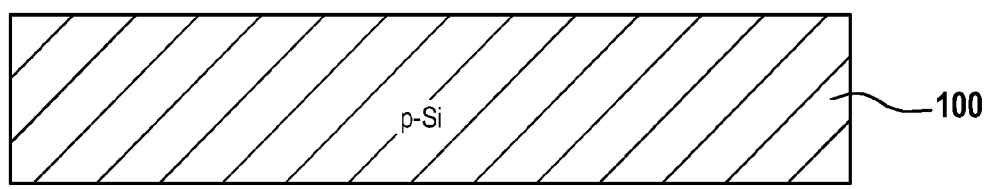
FIGS. 2a-2o illustrate individual steps of manufacturing a solar cell.
Figure 2B:
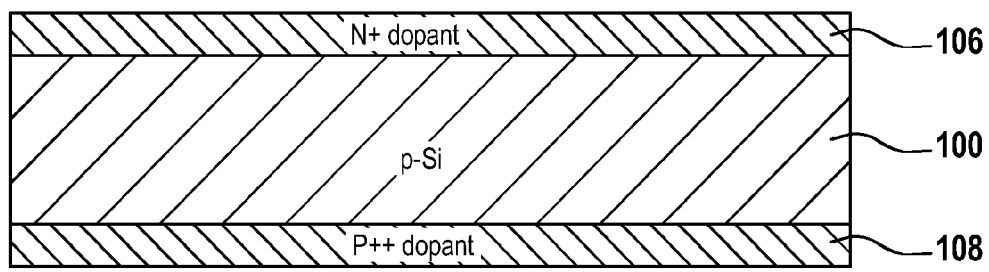
Figure 2C:
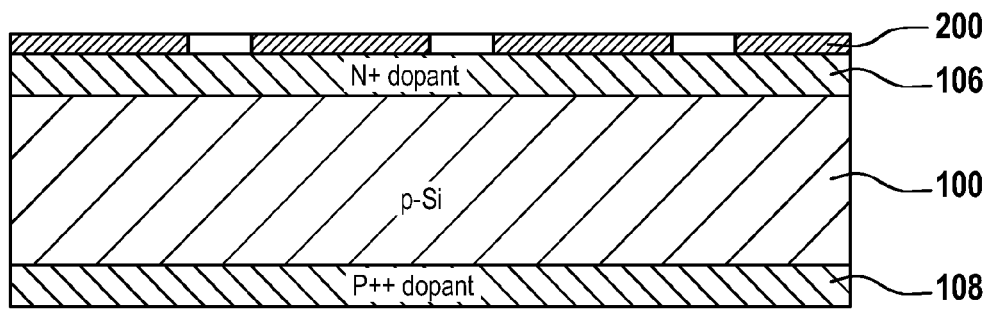
Figure 2D:
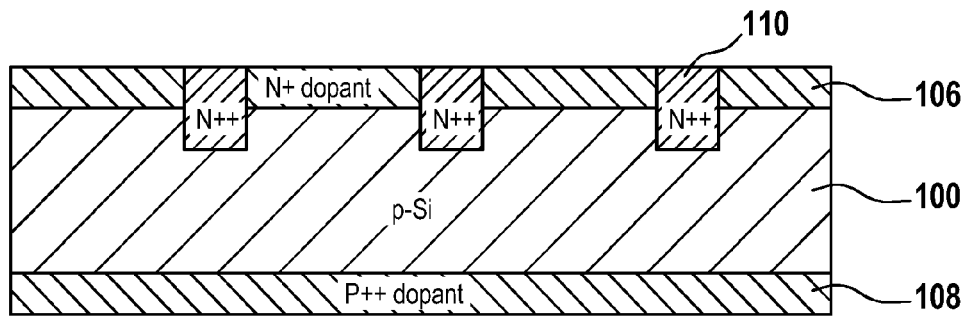
Figure 2E:
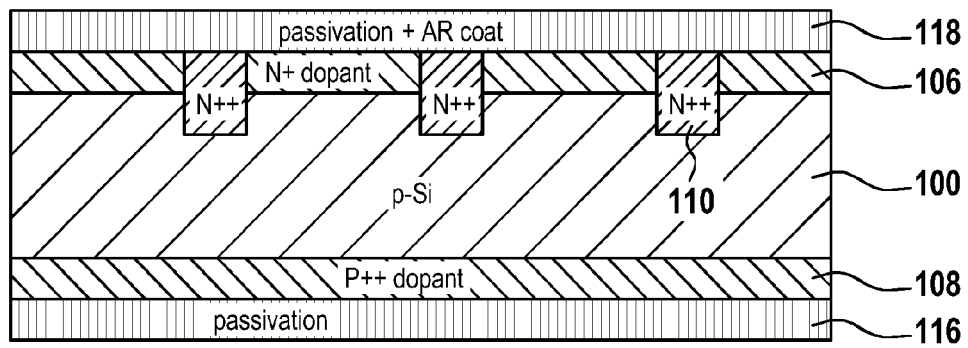
Figure 2F:
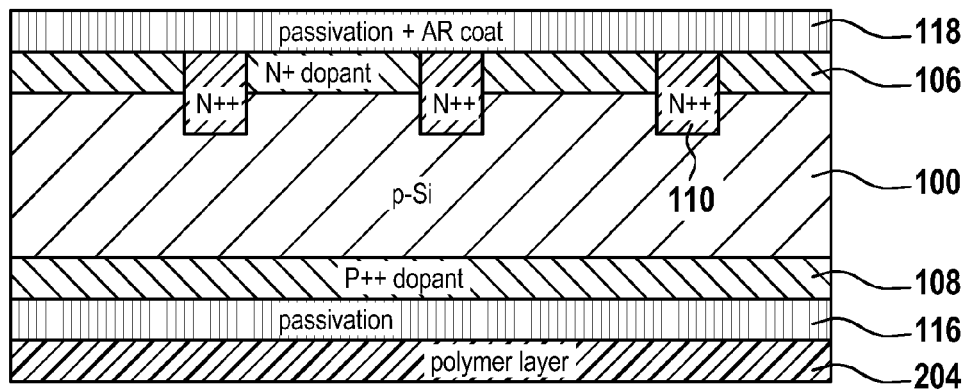
Figure 2G:
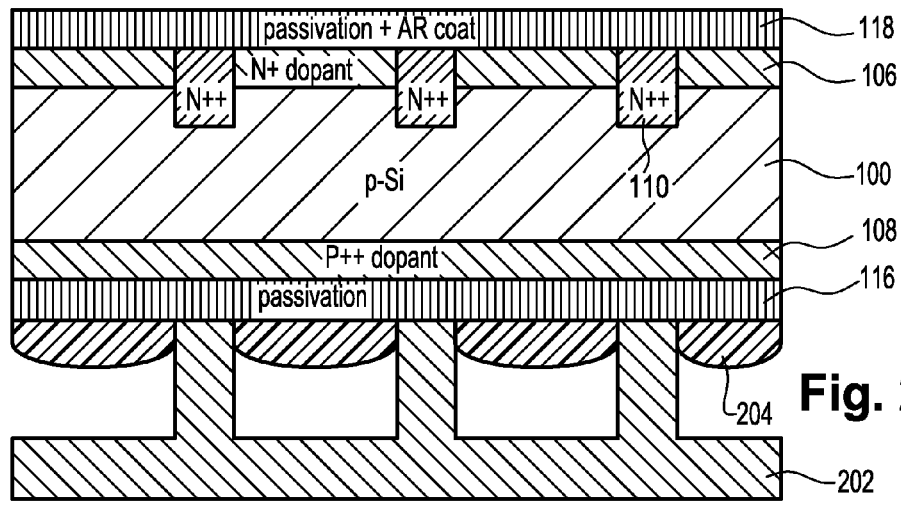
Figure 2H:
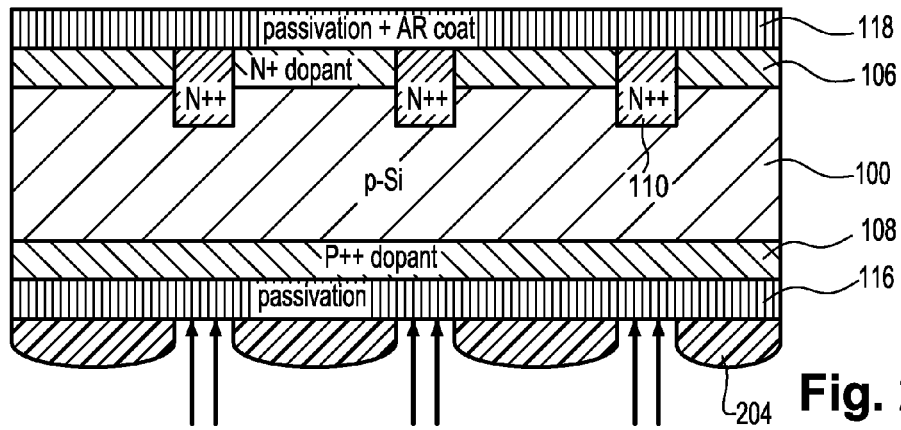
Figure 2I:
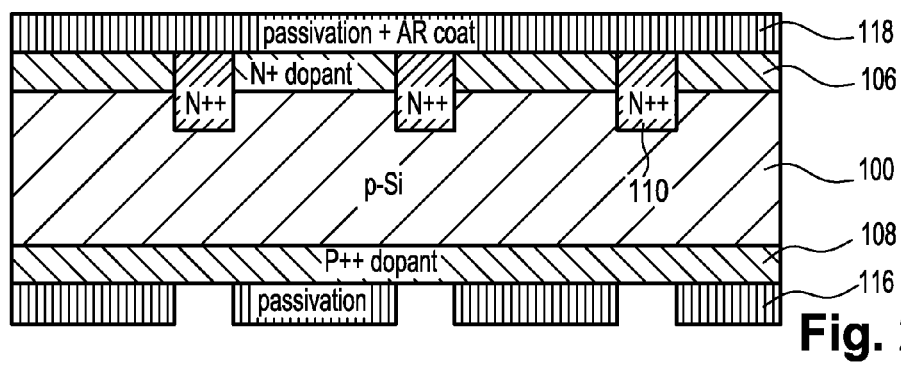
Figure 2J:
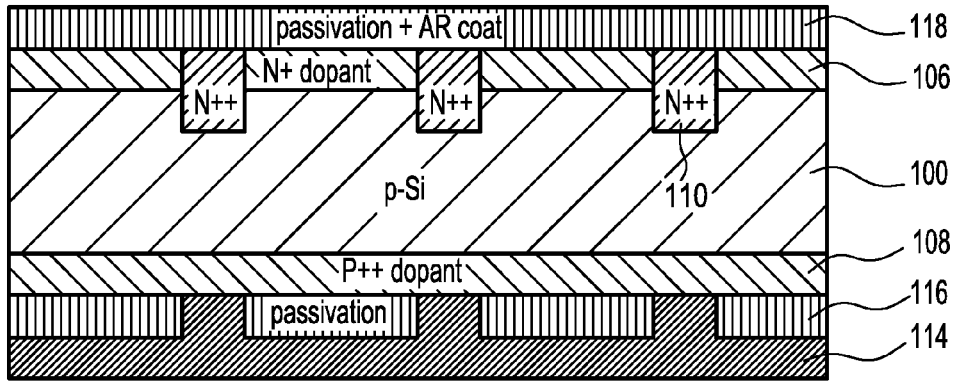
Figure 2K:
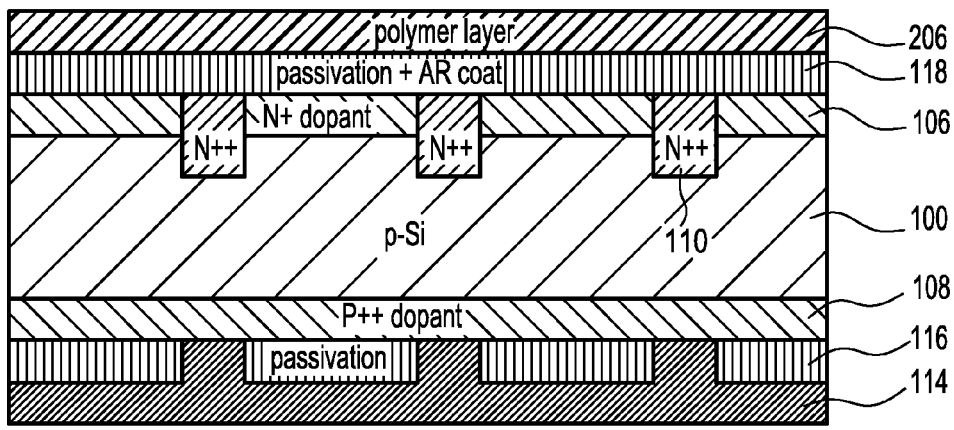
Figure 2L:
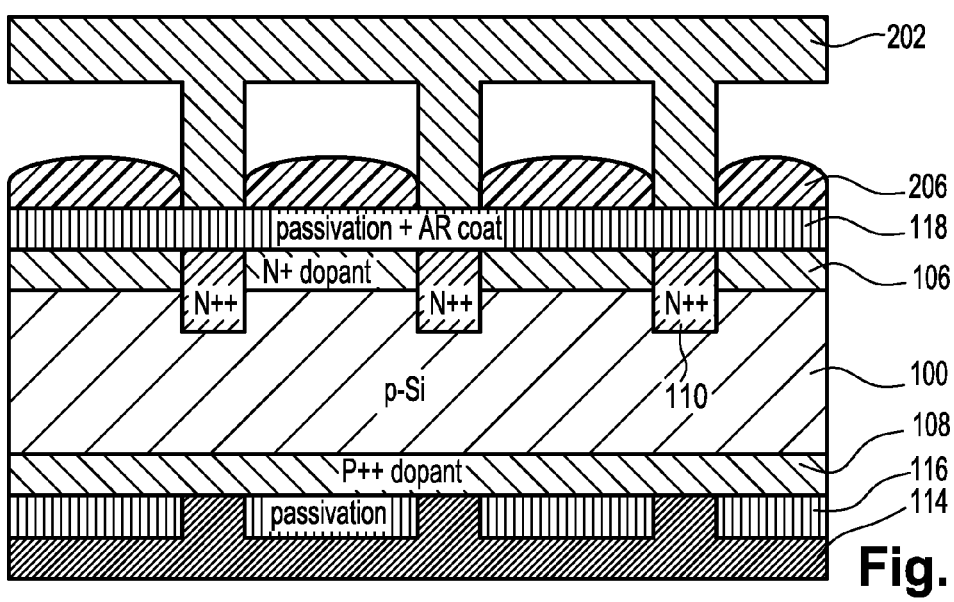
Figure 2M:
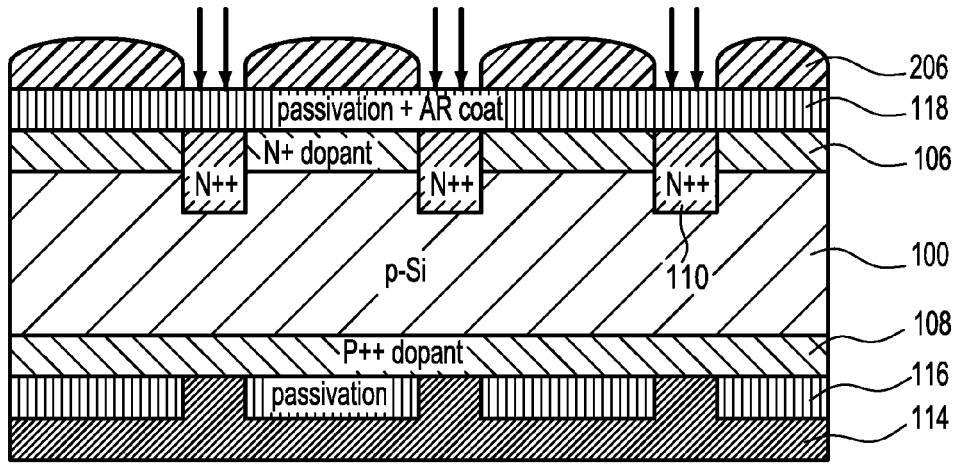
Figure 2N:
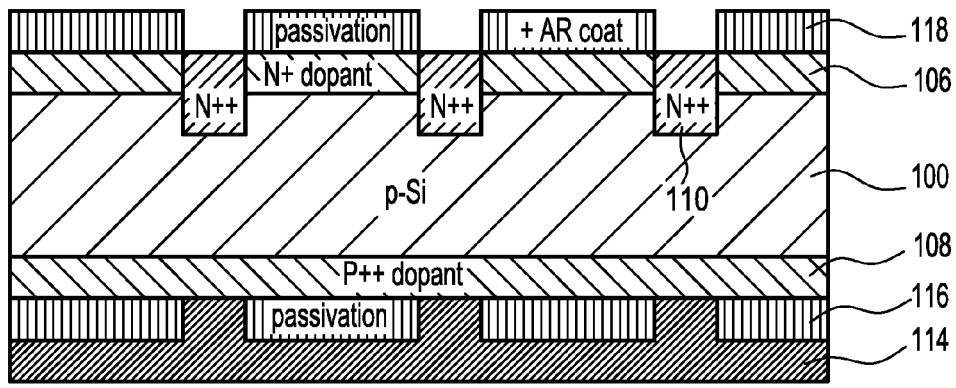
Figure 2O:
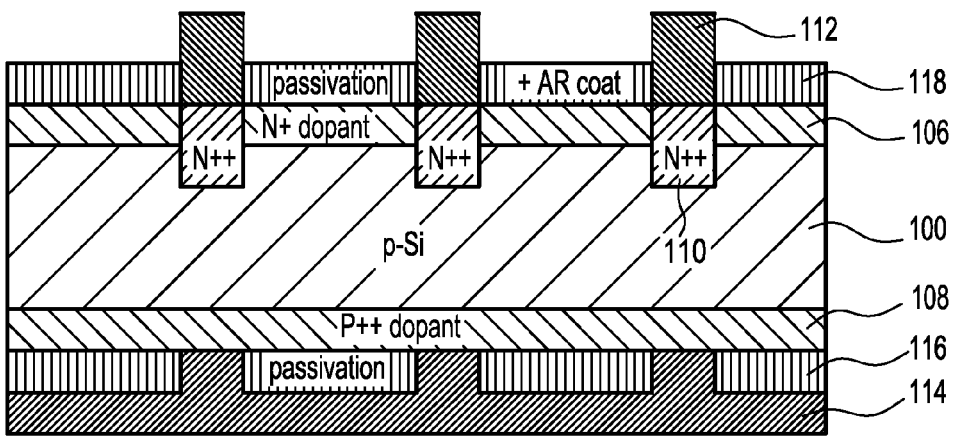

FIGS. 2a-2o illustrate individual steps of manufacturing a solar cell. In step 2a, raw standard p-doped silicon is provided as substrate 100. In FIG. 2b, this substrate 100 is additionally doped with p+ and n+ using standard processes. For example, a dopant material can be applied to the top and bottom surfaces of the substrate 100 followed by a thermal diffusion of the dopants into the bulk silicon substrate 100. This yields the doped first surface 106 and the doped second surface 108.

In the subsequent step illustrated in FIG. 2c, a hard mask 200 is used to cover the doped first surface 106. Not shown in FIG. 2c is the deposition of a further dopant, an n++ dopant to the pattern of the hard mask 200. FIG. 2e shows the resulting material of the removing of the mask 200 and thermal diffusion of the n++ dopant by means of a furnace process not shown here. This results in a doping pattern 110, which is illustrated in FIG. 2d as n++ doped islands.

In FIG. 2e, passivation layers 116 and 118 are applied to the top and bottom surface, for example through oxidation using hydrogen. Furthermore, the top surface is anti-reflecting coated.

As a preparation step for providing electrical contacts to the bottom side of the doped second surface 108, in the step illustrated in FIG. 2f a polymer layer 204 is applied to the bottom passivation layer 116. For example, the polymer layer is applied to the passivation layer 116 by spinning techniques. It is important that this polymer layer 204 is a UV curable polymer layer. Illustrated in FIG. 2g is the usage of a soft stamping technique by which a stamp 202 is applied to the polymer layer 204. The stamp 202 prevents a UV curing of the polymer layer 204 at positions straight line opposed to the islands of the doping pattern 110, such that these positions can be etched away using a respective etchant. This means that in the subsequent step illustrated in FIG. 2h, at the positions HF etching can be performed down to the silicon surface. The passivation layer 116 is penetrated by the etchant and the material of the passivation layer 116, which is located straight line opposed to the islands of the doping pattern 110, is removed. This is shown in FIG. 2i. Further, in FIG. 2i the cured polymer layer is stripped.

Finally, in FIG. 2j an applied set of second electrical contacts is shown. The second electrical contacts 114 can be applied by seeding and contact layer deposition through sputtering.

The subsequent steps describe the application of the top second electrical contacts to the top surface. Thereby, similar steps as already described above with respect to the application of the lower second electrical contacts 114 are performed.

In FIG. 2k a polymer layer 206 is applied to the passivation layer 118. Again, the polymer layer 206 can be applied to the passivation layer 118 by spinning techniques. It is important that the polymer layer 206 is UV curable, such that after application of a stamp 202 to the polymer layer 206 as illustrated in FIG. 2e and subsequent UV curing, an etching can be performed as illustrated in FIG. 2m. By means of the UV cured polymer layer 206, which is only cured at positions spatially located not directly above the islands of the doping pattern 110, the HF etching step permits a removing of material included in the passivation layer 118 directly above the islands 110.

Further as illustrated in FIG. 2n, the cured polymer layer is stripped and, by means of printing or soldering techniques, a contact grid including the first electrical contacts is applied to each on top of the islands of the doping pattern 110. The result is shown in FIG. 2o. Further, by heat treatment of the first electrical contacts 112, the mushroom shaped first electrical contacts 112 as illustrated, for example, in FIG. 1 are obtained.

Figure 3A:
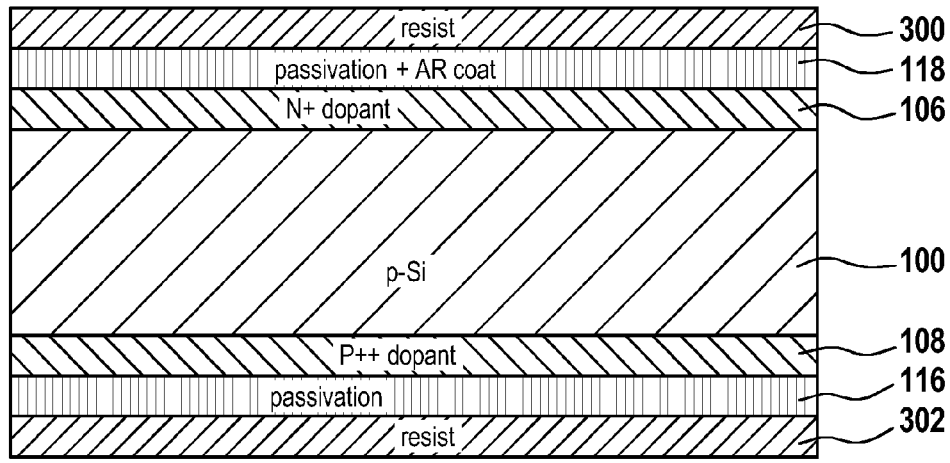
FIGS. 3a-3h illustrate alternative individual steps of manufacturing a solar cell.
Figure 3B:
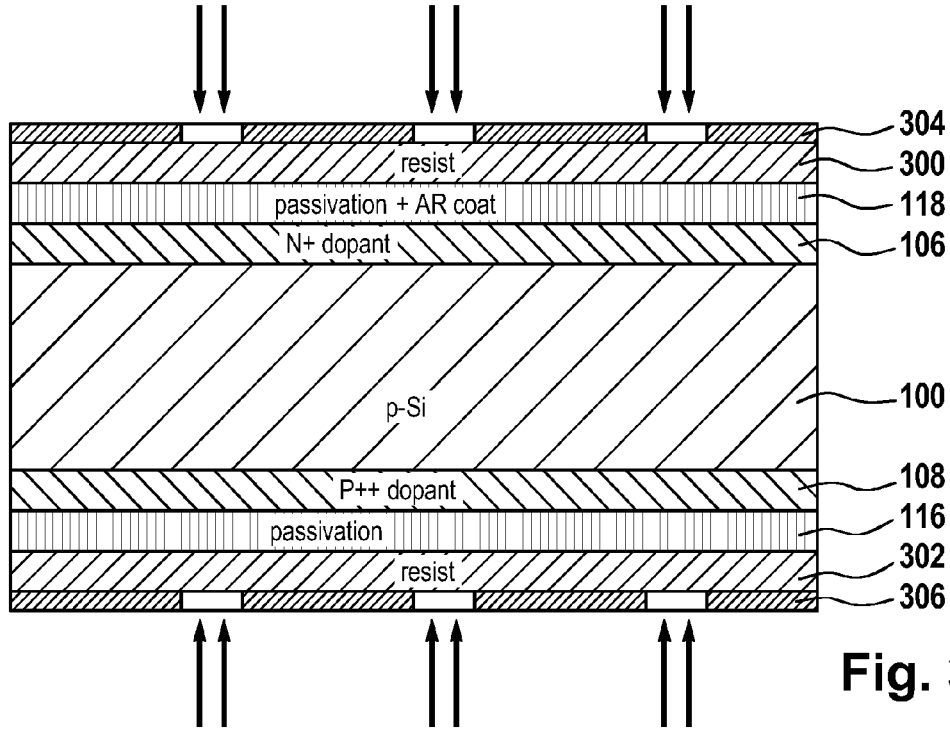

FIGS. 3a-3h illustrate alternative individual steps of manufacturing a solar cell. As illustrated in FIG. 3a, a UV sensitive resist 300 and 302 is spun onto the passivation layer 118 and the passivation layer 116, respectively. After bake time, as illustrated in FIG. 3b, hard masks 304 and 306 are positioned onto the resists 300 and 302, respectively. For example, by oxide ash processes, as illustrated in FIG. 3b, and subsequent reaction ion etching, resist and passivation materials are removed.

Figure 3C:
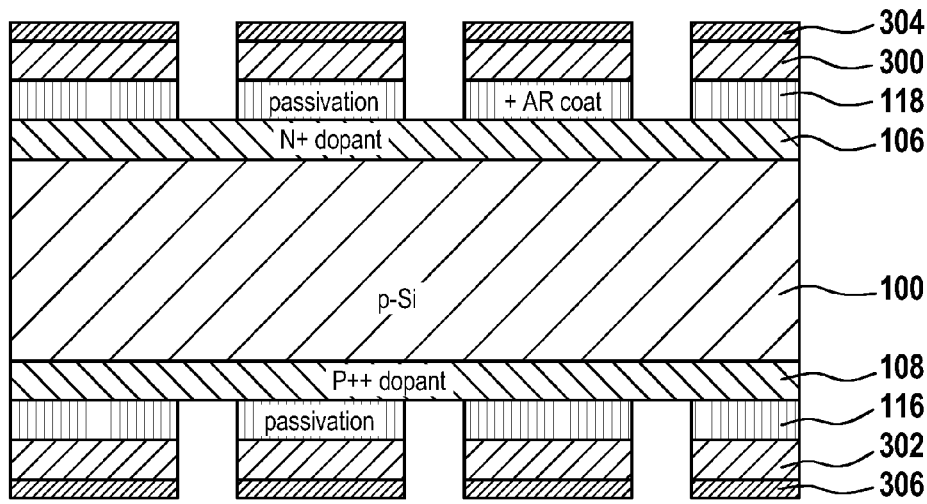
Figure 3D:
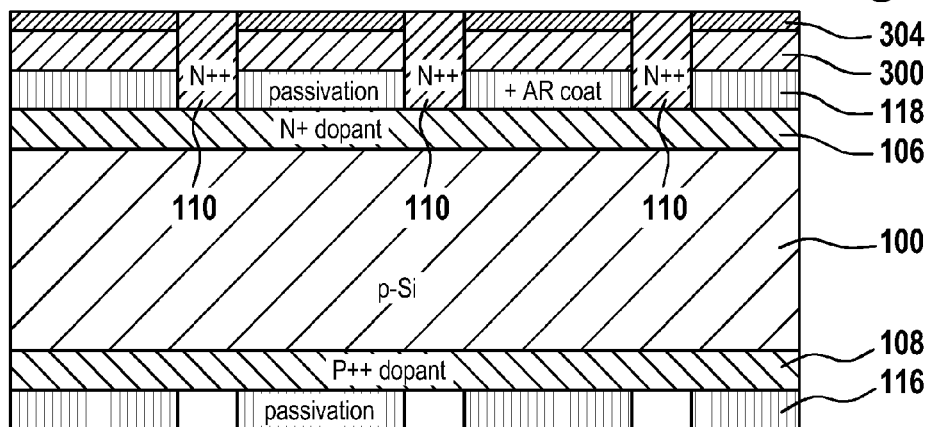

This results in the gaps of the passivation layers 116 and 118 as illustrated in FIG. 3c. Further, the resist 302, which was applied to the passivation layer 116, is stripped and removed and an n++ dopant is applied to the doped first surface 106. This leads to the doping pattern 110 with its respective islands.

Figure 3E:
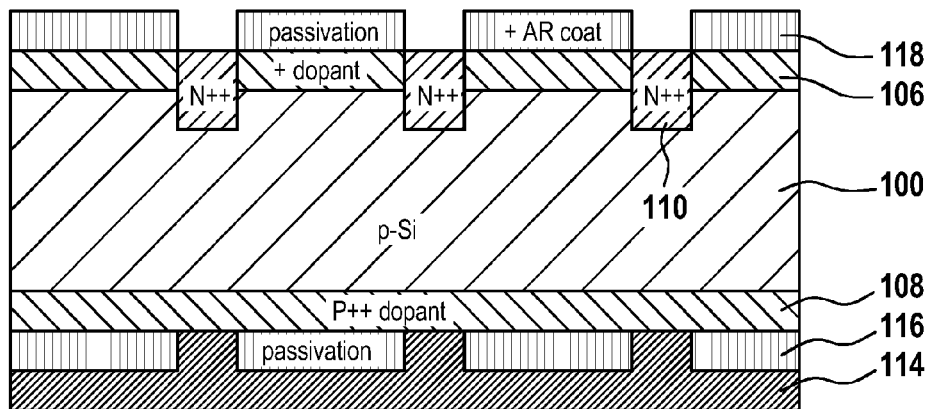

By thermal diffusion of n++, the islands of the doping pattern 110 penetrates into the substrate 100. This is illustrated in FIG. 3e. Further illustrated in FIG. 3e is the application of the second electrical contacts to the doped second surface 108 and the passivation layer 116. This application of the second electrical contacts can be performed by sputtering techniques, for example.

Figure 3F:
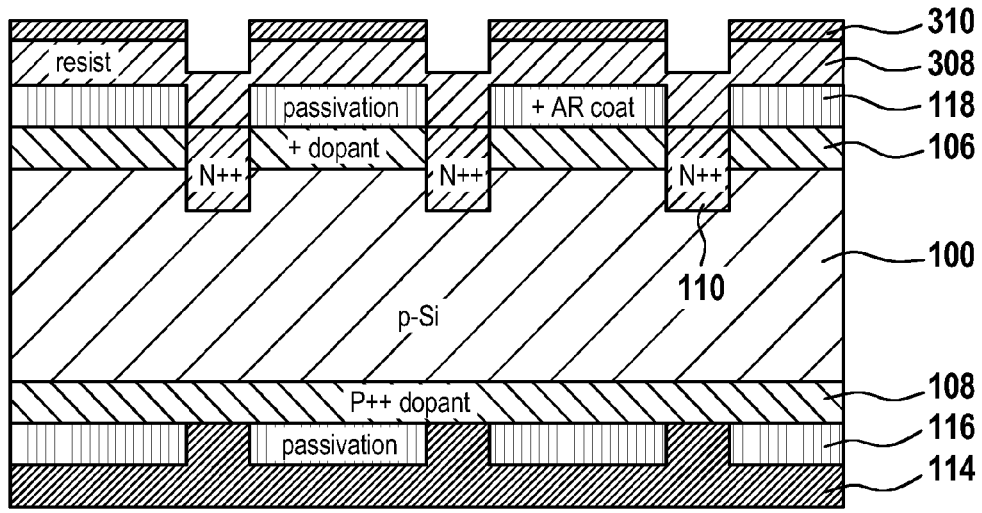
Figure 3G:
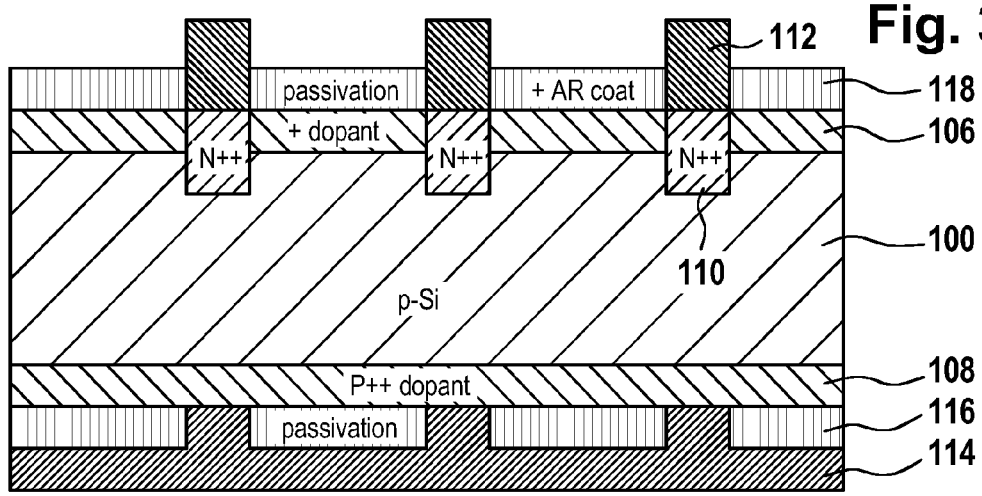

Shown in FIG. 3f are the application of a further resist 308 to the passivation layer 118 and the application of a further mask 310 to the resist 308. Again, this mask 310 has openings, which uncover areas of the resist 308 that are directly located above the islands of the doping pattern 110. By bake curing of the resist, oxide ashing, top contact layer sputtering, removing of the hard mask and stripping of the resist, the device structure illustrated in FIG. 3g is obtained. As can be seen in FIG. 3g, the first electrical contacts are located on top of the islands of the doping pattern 110.

Figure 3H:
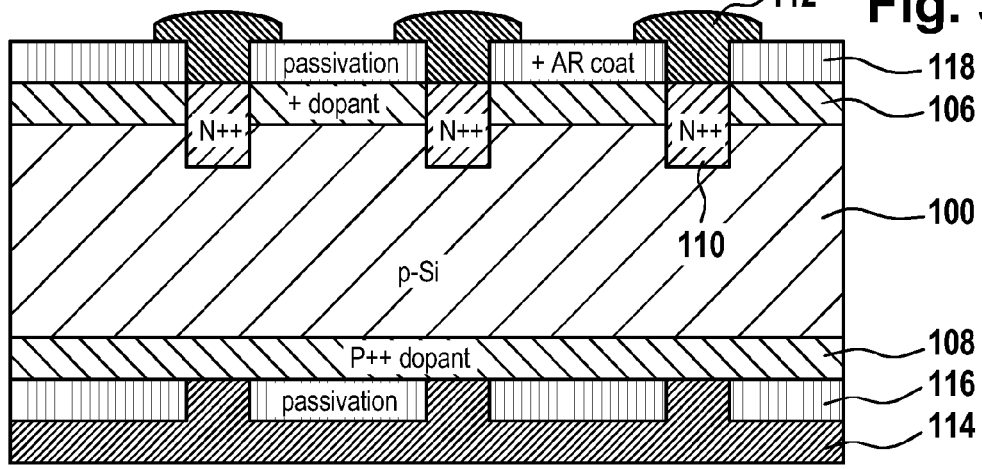

Finally, as illustrated in FIG. 3h, the first electrical contacts 112 are thermally treated to secure the ohmic contact between the silicon and the contact points. For example, such a thermal treatment can be performed by pressing a heated stamp on top of the first electrical contacts 112, wherein the stamp has a shape reflecting the spatial positions of the first electrical contacts 112.

Figure 4:
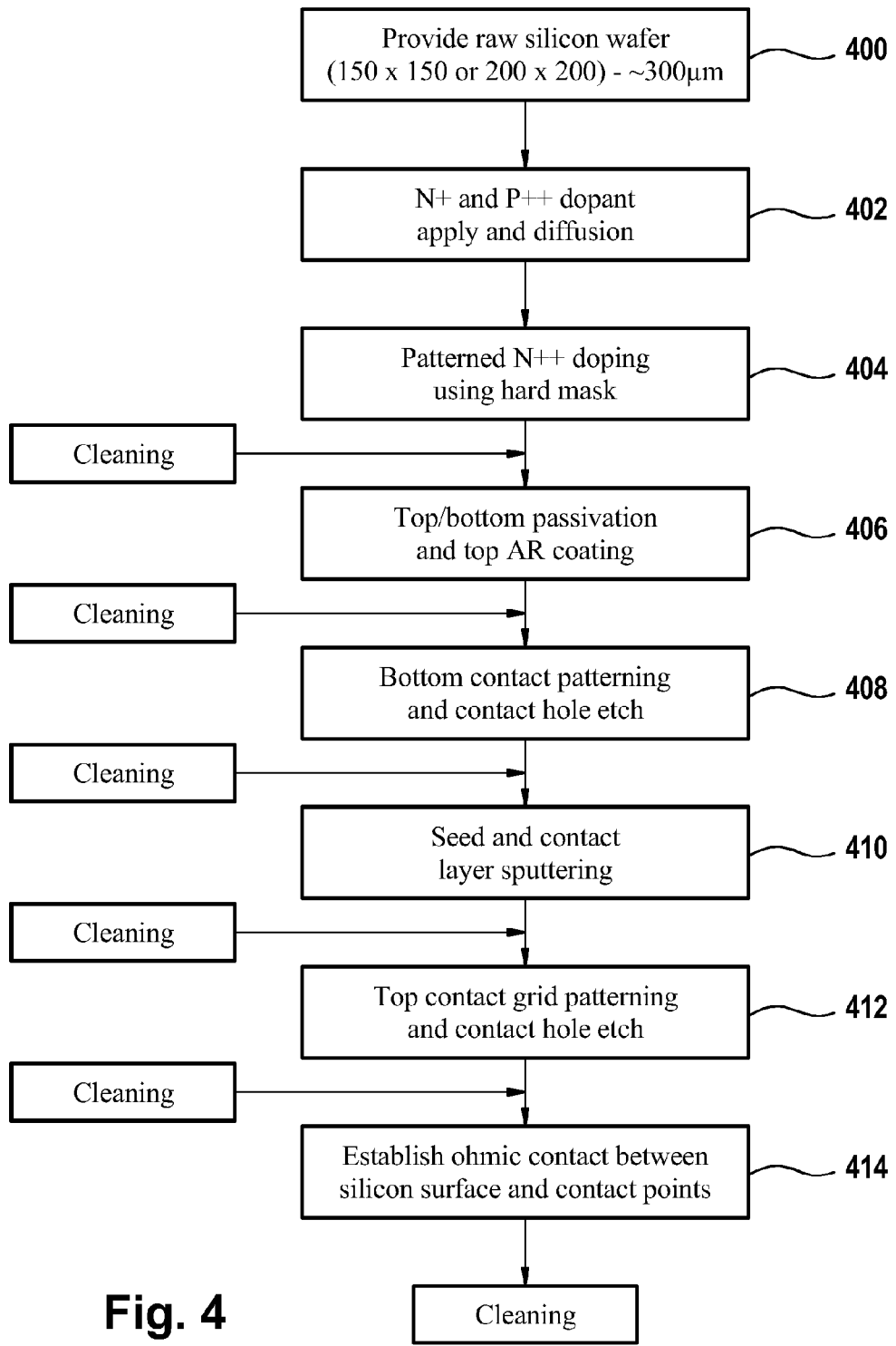
FIG. 4 is a flowchart illustrating the method according to the invention of manufacturing a solar cell.

FIG. 4 is a flowchart illustrating a coarse overview of the method according to the invention of manufacturing a solar cell. In step 400, a raw silicon wafer is provided. Preferably, the silicon wafer is already slightly p-doped. This is followed by step 402, wherein a dopant is deposited onto the top and bottom surfaces of the silicon wafer. This includes in line thermal diffusion. The dopant deposition can be performed by spraying and masking techniques, for example.

In the subsequent step 404, by means of a hard mask, for example, highly doped areas are generated on top of the device, which after thermal diffusion yields the generation of highly doped islands. This is followed by step 406, which is a top/bottom passivation and top anti-reflecting coating.

In step 408, a bottom contact patterning is performed by lithography or hard mask techniques and contact holes are etched, which are filled in step 410 with a contact metal for example by contact layer sputtering. The same holds for the top contacts, which in step 412 requires a top contact grid patterning and contact hole etch procedure, wherein the contact grid deposition can be performed through soldering or printing techniques. Finally in step 414 ohmic contacts between the silicon surface and the contact points, that is the top and bottom contacts, are established by thermal treatments. This can be performed by an in line furnace process to secure proper contact to the silicon surfaces, for example.

While the invention has been described in its preferred embodiments, it is to be understood that the invention is not limited to the embodiments. Rather, various changes in form and details may be made without departing from the spirit and scope of the invention as set forth in the claims.

What is claimed is:

1. A method of manufacturing a solar cell, the method comprising the steps of:
   providing a substrate having a first surface and a second surface, the second surface being opposed to the first surface;
   applying a first dopant to the first surface and a second dopant to the second surface, the application of the first dopant resulting in a doped first surface and the application of the second dopant resulting in a doped second surface;
   covering the doped first surface with a mask, which has a pattern of openings that uncover portions of the doped first surface;
   applying a passivation layer on the doped second surface;
   applying a third dopant to the doped first surface having the mask, the application of the third dopant resulting in a doping pattern that at least partially penetrates into the substrate towards the doped second surface such that a first spatial arrangement of the doping pattern corresponds to a second spatial arrangement of the pattern of openings;
   removing the mask;
   applying a pattern of first electrical contacts onto the doping pattern; and
   applying a pattern of second electrical contacts onto the doped second surface in gaps in the passivation layer that are substantially aligned with the doping pattern;
   wherein the pattern of second electrical contacts and the doping pattern are substantially aligned.

2. The method of claim 1, wherein at least one of the applying of the pattern of the first or second electrical contacts comprises:
   applying a layer to the side of the substrate having at least one of the first doped surface and the substrate side having the second doped surface;
   selectively removing material of the layer substantially aligned with the first spatial arrangement of the doping pattern such that said material results in exposed layer areas; and
   filling the exposed layer areas with electrical contact material.

3. The method of claim 2, wherein the layer comprises a polymer material and the step of selectively removing material of the layer further comprises:

applying a shadow mask to the layer to shadow the layer at areas substantially aligned to the first spatial arrangement of the doping pattern;

curing the layer to produce cured layer areas and uncured layer areas, the uncured layer areas corresponding to the shadowed areas;

removing the shadow mask; and applying an etchant to selectively remove at least some of the polymer material from the layer.

4. The method of claim 2, further comprising: removing the layer.

5. The method of claim 1, wherein the mask is produced by soft stamping.

6. The method of claim 1, further comprising:
treating at least one of the electrical contacts thermally.

7. The method of claim 1, further comprising:
passivating the doped first and second surface.

8. The method of claim 1, wherein the application of the first and second electrical contacts is performed by printing.

9. The method of claim 1, wherein the application of the first and second electrical contacts is performed by soldering.

10. The method of claim 9, wherein the first dopant is an n-dopant and wherein the second dopant is a p-dopant.

11. The method of claim 10, wherein the third dopant is an n-dopant, and wherein the doping pattern having the third dopant has a higher doping level than any surface areas having the first dopant.

12. The method of claim 1, wherein the substrate is p-doped silicon.

13. The method of claim 8, wherein the first dopant is an n-dopant and wherein the second dopant is a p-dopant.

14. The method of claim 13, wherein the third dopant is an n-dopant, wherein the doping pattern comprising the third dopant has a higher doping level than any surface areas having the first the dopant.

* * * * *